(12) United States Patent
Zhu et al.

(10) Patent No.: US 12,042,883 B2
(45) Date of Patent: Jul. 23, 2024

(54) SINTERABLE FILMS AND PASTES AND METHODS FOR USE THEREOF

(71) Applicant: HENKEL AG & CO., KGaA, Duesseldorf (DE)

(72) Inventors: Pukun Zhu, Irvine, CA (US); Shashi Gupta, Tustin, CA (US); Louis Rector, Rochester Hills, MI (US); Qizhuo Zhuo, Irvine, CA (US)

(73) Assignee: HENKEL AG & CO. KGaA, Duesseldorf (DE)

( * ) Notice: Subject to any disclaimer, the term of this patent is extended or adjusted under 35 U.S.C. 154(b) by 0 days.

(21) Appl. No.: 18/328,183

(22) Filed: Jun. 2, 2023

(65) Prior Publication Data

US 2023/0321765 A1    Oct. 12, 2023

Related U.S. Application Data

(63) Continuation of application No. 15/803,137, filed on Nov. 3, 2017, now Pat. No. 11,745,294, which is a
(Continued)

(51) Int. Cl.
*B23K 35/02* (2006.01)
*B23K 35/30* (2006.01)
(Continued)

(52) U.S. Cl.
CPC ........ *B23K 35/025* (2013.01); *B23K 35/3006* (2013.01); *B23K 35/302* (2013.01);
(Continued)

(58) Field of Classification Search
CPC ................ B23K 35/025; B23K 35/3006; B23K 35/302; B23K 35/3033; B23K 35/3613;
(Continued)

(56) References Cited

U.S. PATENT DOCUMENTS 4,020,036 A    4/1977    South
4,101,604 A    7/1978    Rowe
(Continued)

FOREIGN PATENT DOCUMENTS

CN    1545731 A    11/2004
CN    101505911 A    8/2009
(Continued)

OTHER PUBLICATIONS

Atroxtm 800HT1V Technical Data Sheet dated Jun. 2015 (Year: 2015).
(Continued)

*Primary Examiner* — Christopher W Raimund
(74) *Attorney, Agent, or Firm* — Sun Hee Lehmann (57) ABSTRACT

Provided herein are sinterable films and pastes as conductive die attach materials having advantageous properties for use in die semiconductor packages. Also provided are formulations useful for the preparation of such films and pastes, as well as methods for making such formulations. In additional aspects of the present invention, there are provided conductive networks prepared from compositions according to the present invention. In certain aspects, the invention relates to articles comprising such sintering films and pastes adhered to a suitable substrate therefor.

13 Claims, 3 Drawing Sheets

Related U.S. Application Data continuation of application No. PCT/US2016/027182, filed on Apr. 13, 2016.

(60) Provisional application No. 62/158,810, filed on May 8, 2015.

(51) Int. Cl.

| | | |
|---|---|---|
| *B23K 35/36* | (2006.01) | |
| *B32B 7/06* | (2019.01) | |
| *B32B 7/12* | (2006.01) | |
| *B32B 15/08* | (2006.01) | |
| *B32B 15/20* | (2006.01) | |
| *B32B 27/00* | (2006.01) | |
| *B32B 27/08* | (2006.01) | |
| *B32B 27/20* | (2006.01) | |
| *B32B 27/28* | (2006.01) | |
| *B32B 27/30* | (2006.01) | |
| *B32B 27/36* | (2006.01) | |
| *B32B 27/38* | (2006.01) | |
| *B32B 27/40* | (2006.01) | |
| *C08L 63/00* | (2006.01) | |
| *H01L 21/683* | (2006.01) | |
| *H01L 23/00* | (2006.01) | |

(52) U.S. Cl.
CPC ...... *B23K 35/3033* (2013.01); *B23K 35/3613* (2013.01); *B32B 27/00* (2013.01); *C08L 63/00* (2013.01); *H01L 21/6836* (2013.01); *H01L 24/27* (2013.01); *H01L 24/29* (2013.01); *H01L 24/83* (2013.01); *B32B 7/06* (2013.01); *B32B 7/12* (2013.01); *B32B 15/08* (2013.01); *B32B 15/20* (2013.01); *B32B 27/08* (2013.01); *B32B 27/205* (2013.01); *B32B 27/281* (2013.01); *B32B 27/306* (2013.01); *B32B 27/308* (2013.01); *B32B 27/36* (2013.01); *B32B 27/38* (2013.01); *B32B 27/40* (2013.01); *B32B 2255/205* (2013.01); *B32B 2264/102* (2013.01); *B32B 2264/105* (2013.01); *B32B 2264/12* (2013.01); *B32B 2274/00* (2013.01); *B32B 2307/202* (2013.01); *B32B 2307/302* (2013.01); *B32B 2307/542* (2013.01); *B32B 2307/748* (2013.01); *B32B 2457/14* (2013.01); *H01L 2221/68327* (2013.01); *H01L 2221/68377* (2013.01); *H01L 2224/83191* (2013.01); *H01L 2224/8384* (2013.01)

(58) Field of Classification Search
CPC . H01L 24/83; H01L 24/27; H01L 2224/8384; H01L 2221/68377; H01L 21/6836; H01L 2221/68327; H01L 2224/83191; H01L 24/29; B32B 7/06; B32B 7/12; B32B 15/08; B32B 15/20; B32B 27/08; B32B 27/205; B32B 27/281; B32B 27/306; B32B 27/308; B32B 27/36; B32B 27/38; B32B 27/40; B32B 2255/205; B32B 2264/102; B32B 2264/105; B32B 2264/12; B32B 2274/00; B32B 2307/202; B32B 2307/302; B32B 2307/542; B32B 2307/748; B32B 2457/14; B32B 27/00; B32B 27/18; C08L 63/00; C08K 3/11; C08K 3/08; C08K 3/36; C08K 2201/001; C08J 5/18

See application file for complete search history.

(56) References Cited

U.S. PATENT DOCUMENTS

| | | | |
|---|---|---|---|
| 4,160,759 A | 7/1979 | Gardner et al. | |
| 4,161,471 A | 7/1979 | Kassal | |
| 4,186,244 A | 1/1980 | Armstrong et al. | |
| 4,541,876 A | 9/1985 | Hwang | |
| 5,397,618 A | 3/1995 | Cedarleaf | |
| 5,510,197 A | 4/1996 | Takahashi et al. | |
| 5,717,034 A | 2/1998 | Dershem et al. | |
| 6,036,889 A | 3/2000 | Kydd | |
| 6,746,896 B1 | 6/2004 | Shi et al. | |
| 7,422,707 B2 | 9/2008 | Zhuo | |
| 7,722,786 B2 | 5/2010 | Bao et al. | |
| 8,502,086 B2 | 8/2013 | Hondo | |
| 8,673,050 B2 | 3/2014 | Sakuyama et al. | |
| 8,974,705 B2 | 3/2015 | Kuder et al. | |
| 11,745,294 B2 * | 9/2023 | Zhu ............... | H01L 21/6836 |
| | | | 156/307.7 |
| 2001/0042854 A1 | 11/2001 | Matsumoto | |
| 2002/0038582 A1 | 4/2002 | Holl | |
| 2002/0062923 A1 | 5/2002 | Forray | |
| 2002/0190370 A1 | 12/2002 | Shi et al. | |
| 2003/0119226 A1 | 6/2003 | Appelt et al. | |
| 2004/0191501 A1 | 9/2004 | Rasiah | |
| 2006/0199883 A1 | 9/2006 | Banba et al. | |
| 2006/0288837 A1 | 12/2006 | Utz et al. | |
| 2007/0170403 A1 | 7/2007 | Conaghan et al. | |
| 2007/0181858 A1 | 8/2007 | Matsushima et al. | |
| 2008/0166552 A1 | 7/2008 | Cloud et al. | |
| 2008/0202380 A1 | 8/2008 | Bao et al. | |
| 2009/0134206 A1 | 5/2009 | Schmitt et al. | |
| 2009/0236404 A1 | 9/2009 | Yamakawa et al. | |
| 2009/0283725 A1 | 11/2009 | Lee et al. | |
| 2009/0298283 A1 | 12/2009 | Akimoto et al. | |
| 2010/0076120 A1 | 3/2010 | Emmerson et al. | |
| 2010/0084757 A1 | 4/2010 | Hariharan et al. | |
| 2010/0187678 A1 | 7/2010 | Kajiwara et al. | |
| 2010/0243967 A1 | 9/2010 | Hisaeda et al. | |
| 2010/0285233 A1 | 11/2010 | Brasseur et al. | |
| 2011/0039018 A1 | 2/2011 | Brown et al. | |
| 2011/0101543 A1 | 5/2011 | Hayashi et al. | |
| 2011/0105637 A1 | 5/2011 | Fujita et al. | |
| 2011/0210283 A1 | 9/2011 | Ramirez et al. | |
| 2012/0055707 A1 | 3/2012 | Schaefer et al. | |
| 2012/0055978 A1 | 3/2012 | Schaefer et al. | |
| 2012/0069531 A1 | 3/2012 | Das et al. | |
| 2012/0153011 A1 | 6/2012 | Schaefer et al. | |
| 2012/0153012 A1 | 6/2012 | Schaefer et al. | |
| 2012/0164429 A1 | 6/2012 | Shah et al. | |
| 2012/0270515 A1 | 10/2012 | Quinsat et al. | |
| 2013/0153835 A1 | 6/2013 | Hinotsu et al. | |
| 2013/0196504 A1 | 8/2013 | Ogashiwa et al. | |
| 2013/0306916 A1 | 11/2013 | Gao et al. | |
| 2015/0353804 A1 | 12/2015 | Ghosal et al. | |
| 2016/0329122 A1 | 11/2016 | Ishikawa et al. | |

FOREIGN PATENT DOCUMENTS

| | | |
|---|---|---|
| CN | 101965617 A | 2/2011 |
| CN | 102027550 A | 4/2011 |
| CN | 102922177 A | 2/2013 |
| CN | 103443866 A | 12/2013 |
| EP | 2396139 B1 | 5/2014 |
| EP | 2741300 | 6/2014 |
| EP | 2858101 A2 | 4/2015 |
| EP | 2902449 A1 | 8/2015 |
| JP | H0594716 A | 4/1993 |
| JP | 2004165647 A | 6/2004 |
| JP | 2006009076 A | 1/2006 |
| JP | 2006249426 A | 9/2006 |
| JP | 2007056265 A | 3/2007 |
| JP | 2007096302 A | 4/2007 |
| JP | 2010050189 A | 3/2010 |
| JP | 2010180471 A | 8/2010 |
| JP | 2010257880 A | 11/2010 |
| JP | 2011238779 A | 11/2011 |

(56) References Cited

FOREIGN PATENT DOCUMENTS

| | | | |
|---|---|---|---|
| JP | 2012052198 A | 3/2012 | |
| JP | 2012062531 A | 3/2012 | |
| JP | 2013041683 A | 2/2013 | |
| JP | 2013067854 A | 4/2013 | |
| JP | 2013069475 A | 4/2013 | |
| JP | 2013216919 A | 10/2013 | |
| JP | 2015511888 A | 4/2015 | |
| RU | 2016114 C1 | 7/1994 | |
| RU | 2075370 C1 | 3/1997 | |
| RU | 2225587 C2 | 3/2004 | |
| TW | 498349 B | 8/2002 | |
| TW | 502049 B | 9/2002 | |
| TW | 200941656 A | 10/2009 | |
| TW | 201003675 A | 1/2010 | |
| TW | 201309777 A | 3/2013 | |
| TW | 201413739 A | 4/2014 | |
| WO | 2010109465 A1 | 9/2010 | |
| WO | 2011003948 A2 | 1/2011 | |
| WO | 2012006511 A1 | 1/2012 | |
| WO | 2012022011 A1 | 2/2012 | |
| WO | 2013090570 A1 | 6/2013 | |
| WO | 2013172993 A1 | 11/2013 | |
| WO | 2015034579 A1 | 3/2015 | |

OTHER PUBLICATIONS

"High Thermal Silver Sintering Paste." KYOCERA Fineceramics GmbH, . Published 2014, Retrieved from http://www.kyocera.be/index/products/electronica_2014.-cps-15051-files-60621-File.cpsdownload.tmp/High%20Thermal%20Silver%20Sintering%20Paste_V1_2.3.pdf.

Okuma, Sadao. "The Sintering Mechanism of Aluminum and the Anodization of Aluminium Sintered Bodies." Electrocomponent Science and Technology, 1979, vol. 6, pp. 23-29.

Atroxtm D800HT1V MSDS dated Jul. 21, 2014 (Year: 2014).

Jin Howard Hwail et al: "Novel conductive paste using HybridSilver Sintering Technology for high reliability power semiconductorpackaging", 2014 IEEE 64th Electronic Components Andtechnology Conference (ECTC), IEEE, May 27, 2014(May 27, 2014), pp. 1790-1795, XP032642197.

Lu, et al. "Effects of Metallo-Organic Decomposition Agents on Thermal Decomposition and Electrical Conductivity of Low-Temperature-Curing Silver Paste." The Japan Society of Applied Physics, Japanese Journal of Applied Physics, 2006, vol. 45, No. 9a, pp. 6987-6992.

"Aluminum—Aluminum Foil Production" The European Aluminum Foil Association. Dated Added May 28, 2002. Retrieved from http://www.azom.com/article.aspx?ArticleID=1434.

* cited by examiner

SINTERABLE FILMS AND PASTES AND METHODS FOR USE THEREOF

FIELD OF THE INVENTION

The present invention relates to sinterable films and pastes and compositions useful for the preparation of such films and pastes. In one aspect, the invention relates to methods for making such compositions. In another aspect, the invention relates to conductive networks prepared from compositions according to the present invention, and methods for making the same. In yet another aspect, the invention relates to methods for laminating a conductive film onto a substrate and methods for dispensing a conductive paste onto a substrate.

BACKGROUND OF THE INVENTION

Due to environmental regulations mandating the use of lead-free materials in electronics, the die attach industry is focused on soft-solder replacement materials. Additionally, the die attach material must have suitable thermal and electrical conductivity, especially for smaller semiconductor devices with increasing circuit density. Sintering films have not been able to serve this purpose previously because the films are difficult to laminate using conventional laminators used in the semi-conductor industry. Specifically, the sintering films have a high metal content, which causes surface dryness of the sintering film and hinders the laminating and bonding performance of the film. Further, high temperatures and pressures are required to laminate the sintering film onto a wafer and also to subsequently bond the die and film to a substrate. These high temperatures and pressures required for laminating and bonding the sintering films exceed the capacities afforded by the commonly used semiconductor process equipment used in the semiconductor industry.

SUMMARY OF THE INVENTION

In accordance with the present invention, there are provided sinterable (i.e., sintering) films and pastes as conductive die attach materials having advantageous properties for use within the electronics industry and other industrial applications (e.g., in die attach semiconductor packages). For example, the sintering films and pastes described herein can be used for die attach applications on lead-frames for power discretes, for clip attach applications as wire bond replacements for high performance discretes, for heat slug attach applications for the cooling of power discretes with exposed pads, for single- and multi-die devices, and for other devices requiring high electrical and/or thermal conductivity between a die and a frame. Also provided are formulations useful for the preparation of such films and pastes, as well as methods for making such formulations.

In accordance with another aspect of the present invention, there are provided conductive networks prepared from compositions according to the present invention. In certain aspects, the invention relates to articles comprising such sintering films and pastes adhered to a suitable substrate therefor.

The sintering film compositions as described herein can undergo lamination onto a wafer using conventional low temperature and pressure laminators. In addition, the wetting ability between the sintering film and substrate is maintained and a proper sintering morphology is achieved after bonding and cure.

Figure 1A:
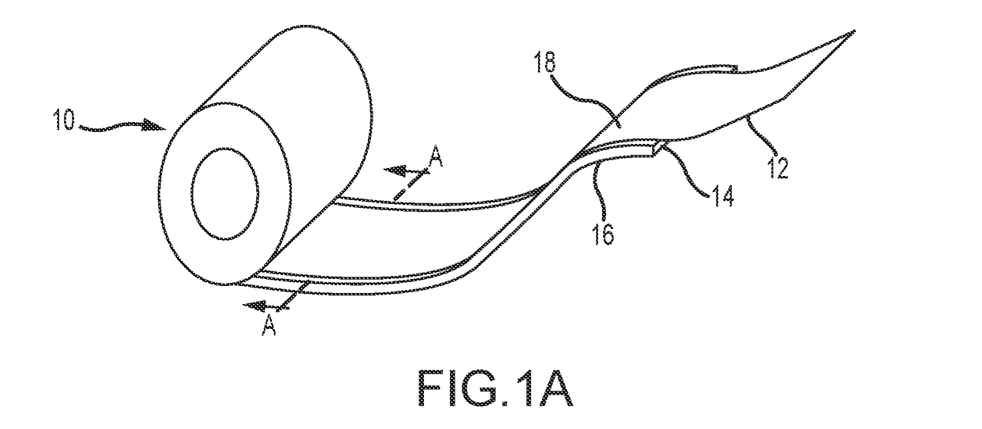
FIG. 1A is a depiction of a sinterable film manufactured in a flexible roll format.
Figure 1B:
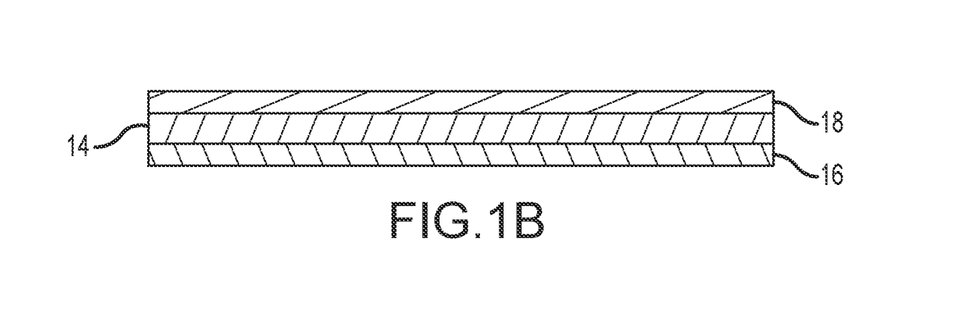
FIG. 1B is a cross sectional view of FIG. 1A along line A-A.
Figure 2A:
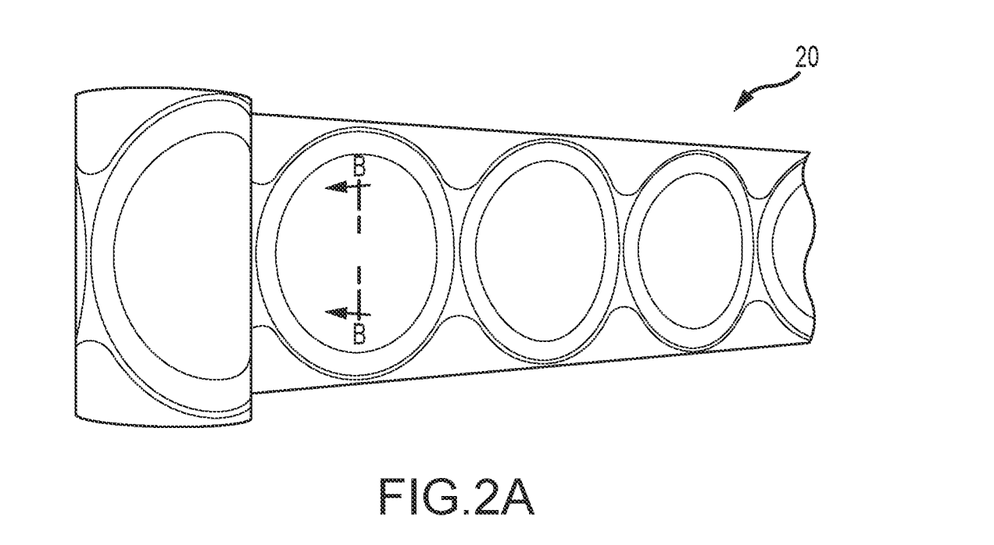
FIG. 2A is a depiction of a sinterable film manufactured in a pre-cut format.
Figure 2B:
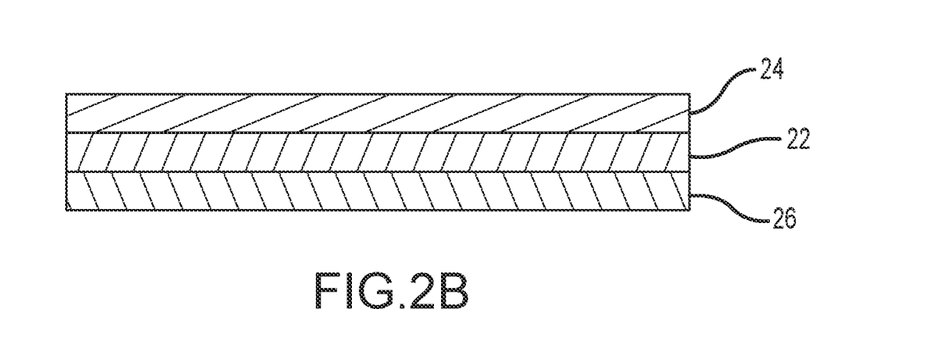
FIG. 2B is a cross sectional view of FIG. 2A along line B-B.

Furthermore, sintering films prepared from the compositions of the present invention can be manufactured in a flexible roll format or in a pre-cut format, as depicted in FIGS. 1 and 2, respectively. In the flexible roll format or the pre-cut format, the film can be sandwiched between suitable substrates for use in those formats, including release liners, dicing tape, and the like. By way of example, the sintering film (labelled as "die attach film" in FIGS. 1 and 2) is sandwiched between two release liners in the flexible roll format shown in FIG. 1 and is sandwiched between a release liner and dicing tape in the pre-cut format shown in FIG. 2.

DETAILED DESCRIPTION OF THE INVENTION

Described herein are compositions and methods of making sintering films having unexpectedly low temperature and pressure lamination properties. Specifically, the compositions described herein include binders, fillers, and other components that result in the low temperature and pressure lamination films. The films exhibit improved processability and wetting ability, without sacrificing the sintering capability of the films as die attach material for semiconductors. In addition, the sintering films, in particular, resulting from the compositions described herein are flexible and can be prepared as a roll by production coaters.

In accordance with the present invention, provided herein are compositions for sintering films comprising:
  at least one thermosetting resin or thermoplastic resin component, including one or more epoxy monomers, oligomers, or polymers, an acrylic monomer, oligomer, or polymer, a phenolic, a novalac, a polyurethane, a cyanate ester, a polyvinyl alcohol, a polyester, a polyurea, a polyvinyl acetal resin, a phenoxy resin, a maleimide, a bismaleimide, a polyimide, or mixtures thereof;
  one or more conductive fillers; and
  optionally an organic diluent,
  wherein the composition undergoes lamination onto a wafer at a temperature of 100° C. or lower and a pressure of 40 psi or lower; and
  wherein the composition, when cured or sintered, has a die shear strength of at least 1.0 kg/mm$^2$ at 260° C., as measured using a die metallized with titanium-nickel-silver and a silver lead-frame substrate.

In some embodiments, the composition, when attached to a die, bonds to a substrate at a pressure of 0.2 kg/mm$^2$ to 1 kg/mm$^2$. The die is not limited by size and can be, for example, 1×1 mm or less up to 8×8 mm or greater.

In accordance with the present invention, also provided herein are compositions for sintering pastes comprising:
  at least one thermosetting resin or thermoplastic resin component, including one or more epoxy monomers, oligomers, or polymers, an acrylic monomer, oligomer, or polymer, a phenolic, a novalac, a polyurethane, a cyanate ester, a polyvinyl alcohol, a polyester, a polyurea, a polyvinyl acetal resin, a phenoxy resin, a maleimide, a bismaleimide, a polyimide, or mixtures thereof;

one or more conductive fillers;

optionally a particulate filler; and an organic diluent, wherein the composition, when cured or sintered, has a die shear strength of at least 1.0 kg/mm$^2$ at 260° C., as measured using a die metallized with titanium-nickel-silver and a silver lead-frame substrate.

The compositions described herein include at least one thermosetting resin or thermoplastic resin component. The thermosetting resin or thermoplastic resin component(s) are provided in the compositions described herein to improve film quality, tackiness, wetting ability, flexibility, work life, high temperature adhesion, resin-filler compatibility, and sintering capability of films prepared from the compositions. In addition, the thermosetting resin or thermoplastic resin component(s) are provided in the compositions described herein to improve rheology, dispensability, work life, and sintering capability of pastes prepared from the compositions. The thermosetting resin or thermoplastic resin component(s) can be any resin capable of providing the above-listed properties to the compositions, including, but not limited to, epoxies, phenolics, novalacs (e.g., phenolic and cresolic), acrylics, polyurethanes, cyanate esters, polyvinyl alcohols, polyesters, polyureas, polyvinyl acetal resins, phenoxy resins, maleimides, bismaleimides, and polyimides, as further described below.

The one or more epoxy monomers, oligomers, or polymers contemplated for use herein, which are also referred to herein as epoxy resins, can include an epoxy having an aliphatic backbone, an aromatic backbone, a modified epoxy resin, or a mixture of these. In certain embodiments, the one or more epoxy monomers, oligomers, or polymers include a functionalized epoxy monomer, oligomer, or polymer. The epoxy functionality in the epoxy resin is at least one. In some embodiments, the epoxy resin is one (i.e., the epoxy resin is a mono-functional epoxy resin). In other embodiments, the epoxy resin contains at least two or more epoxy functional groups (e.g., 2, 3, 4, 5, or more).

The epoxy resins for use in the present invention are not limited to resins having a particular molecular weight. Exemplary epoxy resins can have a molecular weight in the range of about 50 or less up to about 1,000,000. In certain embodiments, epoxy resins contemplated for optional use herein have a molecular weight in the range of about 200,000 up to about 900,000. In other embodiments, epoxy resins contemplated for optional use herein have a molecular weight in the range of about 10,000 up to about 200,000. In still other embodiments, epoxy resins contemplated for optional use herein have a molecular weight in the range of about 1,000 up to about 10,000. In still other embodiments, epoxy resins contemplated for optional use herein have a molecular weight in the range of about 50 up to about 10,000.

In some embodiments, the epoxy resins can be liquid epoxy resins or solid epoxy resins containing aromatic and/or aliphatic backbones, such as the diglycidyl ether of bisphenol F or the diglycidyl ether of bisphenol A. Optionally, the epoxy resin is a flexible epoxy. The flexible epoxy can have a chain length of variable length (e.g., a short chain or a long chain), such as a short-chain length or long-chain length polyglycol diepoxide liquid resin. An exemplary short chain length polyglycol diepoxide liquid resin includes D.E.R. 736 and an exemplary long chain length polyglycol diepoxide liquid resin includes D.E.R. 732, both commercially available from Dow Chemical Company (Midland, MI).

In some embodiments, the epoxy resins can be toughened epoxy resins, such as epoxidized carboxyl-terminated butadiene-acrylonitrile (CTBN) oligomers or polymers, epoxidized polybutadiene diglycidylether oligomers or polymers, heterocyclic epoxy resins (e.g., isocyanate-modified epoxy resins), and the like.

In certain embodiments, the epoxidized CTBN oligomer or polymer is an epoxy-containing derivative of an oligomeric or polymeric precursor having the structure:

wherein:

each Bu is a butylene moiety (e.g., 1,2-butadienyl or 1,4-butadienyl), each ACN is an acrylonitrile moiety, the Bu units and the ACN units can be arranged randomly or in blocks, each of x and y are greater than zero, provided the total of x+y=1, the ratio of x:y falls in the range of about 10:1-1:10, and m falls in the range of about 20 about 100.

As readily recognized by those of skill in the art, epoxidized CTBN oligomers or polymers can be made in a variety of ways, e.g., from (1) a carboxyl terminated butadiene/acrylonitrile copolymer, (2) an epoxy resin and (3) bisphenol A:

by reaction between the carboxylic acid group of CTBN and epoxies (via chain-extension reactions), and the like.

In some embodiments, the epoxy resin can include epoxidized CTBN oligomers or polymers made from (1) a carboxyl terminated butadiene/acrylonitrile copolymer, (2) an epoxy resin, and (3) bisphenol A as described above; Hypro™ Epoxy-Functional Butadiene-Acrylonitrile Polymers (formerly Hycar® ETBN), and the like.

In certain embodiments, the epoxy resin contemplated for use herein includes a rubber or elastomer-modified epoxy. Rubber or elastomer-modified epoxies include epoxidized derivatives of:

(a) homopolymers or copolymers of conjugated dienes having a weight average molecular weight (Mw) of 30,000 to 400,000 or higher as described in U.S. Pat. No. 4,020,036 (the entire contents of which are hereby incorporated by reference herein), in which conjugated dienes contain from 4-11 carbon atoms per molecule (such as 1,3-butadiene, isoprene, and the like);

(b) epihalohydrin homopolymers, a copolymer of two or more epihalohydrin monomers, or a copolymer of an epihalohydrin monomer(s) with an oxide monomer(s) having a number average molecular weight (Mn) which varies from about 800 to about 50,000, as described in U.S. Pat. No. 4,101,604 (the entire contents of which are hereby incorporated by reference herein);

(c) hydrocarbon polymers including ethylene/propylene copolymers and copolymers of ethylene/propylene and at least one nonconjugated diene, such as ethylene/propylene/hexadiene/norbornadiene, as described in U.S. Pat. No. 4,161,471; or (d) conjugated diene butyl elastomers, such as copolymers consisting of from 85 to 99.5% by weight of a $C_4$-$C_5$ olefin combined with about 0.5 to about 15% by weight of a conjugated multi-olefin having 4 to 14 carbon atoms, copolymers of isobutylene and isoprene where a major portion of the isoprene units combined therein have conjugated diene unsaturation (see, for example, U.S. Pat. No. 4,160,759; the entire contents of which are hereby incorporated by reference herein).

In certain embodiments, the epoxy resin is an epoxidized polybutadiene diglycidylether oligomer or polymer.

In certain embodiments, epoxidized polybutadiene diglycidylether oligomers contemplated for use herein have the structure:

wherein:
$R^1$ and $R^2$ are each independently H or lower alkyl,
$R^3$ is H, saturated or unsaturated hydrocarbyl, or epoxy, at least 1 epoxy-containing repeating unit set forth above, and at least one olefinic repeating unit set forth above are present in each oligomer, and, when present, in the range of 1-10 of each repeating unit is present, and n falls in the range of 2-150.

In certain embodiments, an epoxidized polybutadiene diglycidylether oligomer or polymer contemplated for use in the practice of the present invention has the structure:

wherein R is H, OH, lower alkyl, epoxy, oxirane-substituted lower alkyl, aryl, alkaryl, and the like. Further examples of the epoxy resin contemplated for use herein include epoxies having a flexible backbone. For example, the epoxy resin can include:

and the like.

In some embodiments, additional epoxy materials may be included in invention formulations. When included in invention formulations, a wide variety of epoxy-functionalized resins are contemplated for use herein, e.g., epoxy resins based on bisphenol A (e.g., Epon Resin 834), epoxy resins based on bisphenol F (e.g., RSL-1739 or JER YL980), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200L, and the like, as well as mixtures of any two or more thereof.

Additional examples of conventional epoxy materials which are suitable for use as optional additional component of invention formulations include:

and the like.

Exemplary epoxy-functionalized resins contemplated for use herein include the epoxidized CTBN rubbers 561A, 24-440B, and EP-7 (commercially available from Henkel Corporation; Salisbury, NC & Rancho Dominguez, CA); diepoxide of the cycloaliphatic alcohol hydrogenated bisphenol A (commercially available as Epalloy 5000); a difunctional cycloaliphatic glycidyl ester of hexahydrophthallic anhydride (commercially available as Epalloy 5200); ERL 4299; CY-179; CY-184; and the like, as well as mixtures of any two or more thereof.

Optionally, the epoxy resin can be a copolymer that has a backbone that is a mixture of monomeric units (i.e., a hybrid backbone). The epoxy resin can include straight or branched chain segments. In certain embodiments, the epoxy resin can be an epoxidized silicone monomer or oligomer. Optionally, the epoxy resin can be a flexible epoxy-silicone copolymer. Exemplary flexible epoxy-silicone copolymers contemplated for use herein include ALBIFLEX 296 and ALBIFLEX 348, both commercially available from Evonik Industries (Germany).

In some embodiments, one epoxy monomer, oligomer, or polymer is present in the composition. In certain embodiments, combinations of epoxy monomers, oligomers, or polymers are present in the composition. For example, two or more, three or more, four or more, five or more, or six or more epoxy monomers, oligomers, or polymers are present in the composition. Combinations of epoxy resins can be selected and used to achieve the desired properties for films or pastes prepared from the compositions. For example, combinations of epoxy resins can be selected such that films prepared from the compositions exhibit improved film quality, tackiness, wetting ability, flexibility, work life, high temperature adhesion, resin-filler compatibility, and sintering capability. Combinations of epoxy resins can be selected such that pastes prepared from the compositions exhibit improved rheology, dispensability, work life, and sintering capability.

The one or more epoxy monomers, oligomers, or polymers can be present in the composition in an amount of up to about 10 percent by weight of the total solids content of the composition (i.e., the composition excluding diluents). For example, the one or more epoxy monomers, oligomers, or polymers can be present in the composition in an amount of from about 0.1 percent by weight to about 10 percent by weight, from about 0.5 percent by weight to about 8 percent by weight, or from about 1 percent by weight to about 6 percent by weight. In some embodiments, the one or more epoxy monomers, oligomers, or polymers can be present in the composition in an amount of about 10 percent by weight or less, about 9 percent by weight or less, about 8 percent by weight or less, about 7 percent by weight or less, about 6 percent by weight or less, about 5 percent by weight or less, about 4 percent by weight or less, about 3 percent by weight or less, about 2 percent by weight or less, or about 1 percent by weight or less based on the weight of the total solids content of the composition.

The compositions described herein can further include an acrylic monomer, polymer, or oligomer. Acrylates contemplated for use in the practice of the present invention are well known in the art. See, for example, U.S. Pat. No. 5,717,034, the entire contents of which are hereby incorporated by reference herein. The acrylic monomer, polymer, or oligomer for use in the present invention are not limited to a particular molecular weight. Exemplary acrylic resins can have a molecular weight in the range of about 50 or less up to about 1,000,000. In some embodiments, acrylic polymers contemplated for optional use can have a molecular weight in the range of about 100 up to about 10,000 and a Tg in the range of about −40° C. up to about 20° C. In certain embodiments, acrylic polymers contemplated for optional use herein have a molecular weight in the range of about 10,000 up to about 900,000 (e.g., about 100,000 up to about 900,000 or about 200,000 up to about 900,000) and a Tg in the range of about −40° C. up to about 20° C. Examples of acrylic copolymers for use in the compositions described herein include Teisan Resin SG-P3 and Teisan Resin SG-80H (both commercially available from Nagase Chemtex Corp.; Japan). Optionally, the acrylic polymer or oligomer for use in the compositions described herein can be degradable acrylic polymers or oligomers or epoxy-modified acrylic resins.

The acrylic monomer, polymer, or oligomer can be present in the composition in an amount of up to about 10 percent by weight of the total solids content of the composition. For example, the acrylic monomer, copolymer, or oligomer can be present in the composition in an amount from about 0.05 percent by weight to about 7 percent by weight or from about 0.1 percent by weight to about 3 percent by weight. In some embodiments, the acrylic monomer, copolymer, or oligomer is present in the composition in an amount of about 10 percent by weight or less, about 9 percent by weight or less, about 8 percent by weight or less, about 7 percent by weight or less, about 6 percent by weight or less, about 5 percent by weight or less, 4 percent by weight or less, about 3 percent by weight or less, about 2 percent by weight or less, or about 1 percent by weight or less based on the weight of the total solids content of the composition.

Additional thermosetting resin or thermoplastic resin components for use in the compositions described herein can include polyurethanes, cyanate esters, polyvinyl alcohols, polyesters, polyureas, polyvinyl acetal resins, and phenoxy resins. In some embodiments, the compositions can include imide-containing monomers, oligomers, or polymers, such as maleimides, nadimides, itaconimides, bismaleimides, or polyimides.

The thermosetting resin or thermoplastic resin components, including the one or more epoxy monomers, polymers, or oligomers; the acrylic monomers, polymers, or oligomers, the phenolics; the novalacs; the polyurethanes; the cyanate esters; the polyvinyl alcohols; the polyesters; the polyureas; the polyvinyl acetal resins; the phenoxy resins; and/or the imide-containing monomers, polymers, or oligomers (e.g., the maleimides, bismaleimides, and polyimides) can be combined to form a binder. The binder can be solid, semi-solid, or liquid. Optionally, the binder has a decomposition temperature of less than 350° C.

The compositions described herein also include one or more conductive fillers, including silver. In some embodiments, the conductive filler present in the composition is silver. In other embodiments, one or more additional conductive fillers can be included along with silver. Additional conductive fillers contemplated for use in the practice of the present invention include nickel, cobalt, copper, silver-plated metals, nickel-plated metals, silver-plated graphite, silver-coated polymers, nickel-plated graphite, nickel-plated polymers, gold, palladium, platinum, carbon black, carbon fiber, graphite, carbon nanotubes, aluminum, indium tin oxide, silver-coated copper, silver-coated aluminum, silver-coated graphite, nickel-coated graphite, bismuth, tin, bismuth-tin alloy, metal-coated glass spheres, silver-coated fiber, silver-coated spheres, antimony doped tin oxide, carbon nanotubes, conductive nanofillers, alloys of such metals, and the like, as well as mixtures of any two or more thereof. These and similar metals and metal alloys are commercially available.

The conductive filler can have a size suitable for use in the methods described herein and is not limited to any particular range. Exemplary conductive fillers, such as silver, can have an average particle size ranging from about 0.1 μm to about 20 μm. In some embodiments, the conductive filler can have an average particle size ranging from about 1 μm to about 10 μm. In other embodiments, the conductive filler can have an average particle size that ranges from about 1 μm to about 3 μm.

In some embodiments, silver is present as the major conductive filler (i.e., at least 50 weight percent, at least 60 weight percent, at least 70 weight percent, at least 80 weight percent, or at least 90 weight percent) of the total conductive fillers present in the composition) along with one or more additional conductive fillers.

The conductive filler is present in the composition in an amount of at least 65 percent by weight of the total solids content of the composition. For example, the conductive filler can be present in the composition in an amount of from about 65 percent by weight to about 95 percent by weight or from about 75 percent by weight to about 85 percent by weight. In some embodiments, the conductive filler can be present in the composition in an amount of at least about 65 percent by weight, at least about 70 percent by weight, at least about 75 percent by weight, at least about 80 percent by weight, at least about 85 percent by weight, or at least about 90 percent by weight of the total solids content of the composition.

The compositions described herein can optionally include one or more particulate fillers. The particulate filler can include, for example, silica, nickel-based alloys, iron-based alloys, zirconium tungstate, or mixtures thereof. For example, the particulate filler can be a nickel/iron composition or a lithium aluminium silicate. Exemplary particulate fillers have a coefficient of thermal expansion (CTE) of 10 ppm/° ° C. or lower (e.g., 5 ppm/° C. or lower, 0 ppm/° C. or lower, or −5 ppm/° C. or lower). In some embodiments, the particulate fillers can include the following materials: alloy 42, carbon nanotubes, β-eucryptite, α-$ZrW_2O_6$, β-$ZrW_2O_8$, $Cd(CN)_2$, $ReO_3$, $(HfMg)(WO_4)_3$, $Sm_{2.75}C_{60}$, $Bi_{0.95}La_{0.05}NiO_3$, Invar (Fe-36Ni), Invar ($Fe_3Pt$), $Tm_2Fe_{16}Cr$, CuO nanoparticles, $Mn_3Cu_{0.53}Ge_{0.47}N$, $Mn_3ZN_{0.4}Sn_{0.6}N_{0.85}C_{0.15}$, $Mn_3Zn_{0.5}Sn_{0.5}N_{0.85}C_{0.1}B_{0.05}$, and mixtures thereof.

The particulate filler can be present in the composition in an amount of about 20 percent by weight or less (i.e., up to 20 percent by weight) of the total solids content of the composition. For example, the particulate filler can be present in the composition in an amount of less than about 20 percent by weight, less than about 19 percent by weight, less than about 18 percent by weight, less than about 17 percent by weight, less than about 16 percent by weight, less than about 15 percent by weight, less than about 14 percent by weight, less than about 13 percent by weight, less than about 12 percent by weight, less than about 11 percent by weight, less than about 10 percent by weight, less than about 9 percent by weight, less than about 8 percent by weight, less than about 7 percent by weight, less than about 6 percent by weight, less than about 5 percent by weight, less than about 4 percent by weight, less than about 3 percent by weight, less than about 2 percent by weight, or less than about 1 percent by weight of the total solids content of the composition.

The compositions described herein can further include a diluent, including, for example, an organic diluent. The organic diluent can be a reactive organic diluent, a non-reactive organic diluent, or a mixture thereof. Exemplary diluents include, for example, aromatic hydrocarbons (e.g., benzene, toluene, xylene, and the like); aliphatic hydrocarbons (e.g., hexane, cyclohexane, heptane, tetradecane, and the like); chlorinated hydrocarbons (e.g., methylene chloride, chloroform, carbon tetrachloride, dichloroethane, trichloroethylene, and the like); ethers (e.g., diethyl ether, tetrahydrofuran, dioxane, glycol ethers, monoalkyl or dialkyl ethers of ethylene glycol, and the like); esters (e.g., ethyl acetate, butyl acetate, methoxy propyl acetate, and the like); polyols (e.g., polyethylene glycol, propylene glycol, polypropylene glycol, and the like); ketones (e.g., acetone, methyl ethyl ketone, and the like); amides (e.g., dimethylformamide, dimethylacetamide, and the like); heteroaromatic compounds (e.g., N-methylpyrrolidone, and the like); and heteroaliphatic compounds.

The amount of non-reactive diluent contemplated for use in accordance with the present invention can vary widely, so long as a sufficient quantity is employed to dissolve and/or disperse the components of invention compositions. When present, the amount of non-reactive diluent employed typically falls in the range of about 2 up to about 30 percent by weight of the composition. In certain embodiments, the amount of non-reactive diluent falls in the range of about 5 up to 20 percent by weight of the total composition. In some embodiments, the amount of non-reactive diluent falls in the range of about 10 up to about 18 percent by weight of the total composition. The amount of reactive diluent contemplated for use in accordance with the present invention can be up to 5 percent by weight of the composition (e.g., 5 percent or less, 4 percent or less, 3 percent or less, 2 percent or less, or 1 percent or less).

As readily recognized by those of skill in the art, in certain embodiments, invention compositions contain substantially no non-reactive diluent therein. Even if non-reactive diluent is, at one time, present, it can be removed during the formation of films in the B-staging process, as further described herein.

The compositions described herein can optionally include one or more curing agents. The curing agents can optionally function as conductivity promoters and/or reducing agents in the compositions. Curing agents contemplated for use in the practice of the present invention include ureas, aliphatic and aromatic amines, polyamides, imidazoles, dicyandiamides, hydrazides, urea-amine hybrid curing systems, free radical initiators, organic bases, transition metal catalysts, phenols, acid anhydrides, Lewis acids, Lewis bases, and the like. See, for example, U.S. Pat. No. 5,397,618, the entire contents of which are hereby incorporated by reference herein.

The curing agent can optionally be present in the composition in an amount of up to about 4 percent by weight of the total solids content of the composition. In some embodiments, the curing agent is absent from the composition (i.e., 0 percent by weight of the total solids content of the composition). In other embodiments, the curing agent can be present in the composition in an amount from about 0.05 percent by weight to about 4 percent by weight or from about 0.1 percent by weight to about 3 percent by weight. Optionally, the curing agent is present in the composition in an amount of about 4 percent by weight or less, about 3 percent by weight or less, about 2 percent by weight or less, or about 1 percent by weight or less.

The compositions described herein can optionally include one or more fluxing agents, such as a carboxylic acid. Optionally, the fluxing agent for use in the compositions can be a latent fluxing agent that rearranges during the sintering process to release carboxylic acid, which acts as the fluxing agent. An example of a latent fluxing agent suitable for use in the compositions described herein includes the following structure, referred to herein as the Diacid 1550-VEGE adduct:

Diacid 1550/VEGE

The fluxing agents can be present in the composition in an amount of up to about 10 percent by weight of the total solids content of the composition. For example, the fluxing agents can be present in the composition in an amount of from about 0.1 percent by weight to about 10 percent by weight, from about 0.2 percent by weight to about 8 percent by weight, or from about 1 percent by weight to about 5 percent by weight. In some embodiments, the fluxing agents are present in the composition in an amount of about 10 percent by weight or less, about 9 percent by weight or less, about 8 percent by weight or less, about 7 percent by weight or less, about 6 percent by weight or less, about 5 percent by weight or less, about 4 percent by weight or less, about 3 percent by weight or less, about 2 percent by weight or less, or about 1 percent by weight or less. In some embodiments, the fluxing agent is absent from the composition (i.e., 0 percent by weight).

The compositions described herein can further optionally include one or more additional components: a flow additive, an adhesion promoter, a rheology modifier, a conductivity promoter (e.g., peroxide), a surfactant, a toughening agent, a film flexibilizer, an epoxy-curing catalyst, a curing agent, a radical polymerization regulator, a radical stabilizer, or mixtures thereof.

The amount of each component of invention compositions can vary widely. Exemplary compositions comprise:

up to 10 wt % of one or more epoxy monomers, oligomers, or polymers,
up to 10 wt % of said acrylic monomer, oligomer, or polymer,
optionally, up to 4 wt % of said imide-containing monomer, oligomer, or polymer,
at least 65 wt % of said conductive filler,
optionally, up to 5 wt % of an additional component selected from an adhesion promoter, a conductivity promoter, and a surfactant, and
optionally, up to 20 wt % of a particulate filler,
each based on the weight percentage of the total solids content of the composition.

Optionally, the compositions can comprise up to 30 wt % of an organic diluent.

In some embodiments, the amount of each component of invention compositions falls in the range of about:
1-10 wt % of said one or more epoxy monomers, oligomers, or polymers,
1-10 wt % of said acrylic monomer, oligomer, or polymer,
65-95 wt % of said conductive filler,
optionally, up to 5 wt % of one or more additional components selected from an adhesion promoter, a conductivity promoter, and a surfactant,
optionally, 3-20 wt % of a particulate filler,
each based on the weight percentage of the total solids content of the composition.

Optionally, the compositions can comprise up to 5 wt % of an organic diluent.

In some embodiments, the amount of each component of invention compositions falls in the range of about:
1-6 wt % of said one or more epoxy monomers, oligomers, or polymers,
optionally, up to 3 wt % (i.e., 0-3 wt %) of said acrylic monomer, oligomer, or polymer,
65-95 wt % of said conductive filler,
optionally, up to 5 wt % of an additional component selected from an adhesion promoter, a conductivity promoter, and a surfactant,
3-20 wt % of a particulate filler,
each based on the weight percentage of the total solids content of the composition.

Optionally, the compositions can comprise up to 30 wt % of an organic diluent.

The compositions described herein provide a number of useful performance properties. For example, the composition, when cured or sintered, has a die shear strength of at least 1.0 kg/mm$^2$ at 260° C. (e.g., at least 1.5 kg/mm$^2$ at 260° C.). In addition, the composition undergoes lamination onto a wafer at a temperature of 100° C. or lower and a pressure of 40 psi or lower. Further, the composition, in the form of a film, can undergo dicing and pick-up processes to result in a die/film that can bond to a substrate at a temperature that can range from about 110° C. to 350° C. and under a pressure of from about 0.2 to 1 kg/mm². The die size can range from about 1×1 mm or less to about 8×8 mm or greater. The bonding time can be less than 3 seconds. These performance properties are further described below.

In certain embodiments of the present invention, there are provided methods of making the compositions described herein. The invention compositions can be made in the form of a sintering film or in the form of a sintering paste.

Invention methods for forming a sintering film comprise subjecting the contemplated combination of components to high shear mixing for a period of time sufficient to obtain a substantially homogeneous blend. In some embodiments, the components can be mixed for a period of time up to about 3 hours (e.g., from about 1 hour to 3 hours). The combination of components can be mixed at room temperature.

In embodiments where the composition is to be in the form of a sintering film, the compositions are applied to a suitable substrate (e.g., a release liner), and then heated at elevated temperature to remove substantially all of the non-reactive diluent (i.e., solvent) therefrom. For example, at least 65%, at least 75%, at least 80%, at least 85%, at least 90%, at least 95%, or at least 99% of the solvent can be removed. The process of heating the sintering paste to dry it into a film is referred to herein as B-staging. The resulting film can have a thickness of from about 5 microns to about 50 microns.

In certain embodiments of the present invention, there are provided sintering films comprising the reaction product obtained upon removing substantially all of the solvent/diluent from the above-described B-staged compositions. The film can be wound on a roll.

The film as described herein can be laminated onto a substrate (e.g., a wafer) using a conventional laminator in the semi-conductor industry. For example, the film can be laminated onto a wafer using a roll laminator. Exemplary laminators that can be used include the DFM 2700 (Disco Corporation; Japan), the Leonardo 200 LD (Microcontrol Electronic; Italy), and the Western Magnum XRL-120 (El Segundo, CA). As described above, the lamination can be performed at a temperature of less than 100° ° C. (e.g., 95° C. or less, 90° C. or less, 85° C. or less, 80° C. or less, 75° C. or less, 70° C. or less, or 65° C. or less). The lamination can be performed at a pressure of 40 psi or less (e.g., 35 psi or less or 30 psi or less).

The release liner, if used, can be peeled off from the film. The film can then be laminated to a dicing tape, which serves as support during the dicing process. The lamination of the film to the dicing tape can be performed at room temperature. As a result of the lamination process, the film is held between and in direct contact with the dicing tape and the wafer. During the dicing process, the wafer and film can be diced into individual dies with the film adhered to the die. The individual dies and adhered film can be removed from the dicing tape during the pick-up process and then can be attached to a substrate in a bonding/die attach step. The bonding/die attach step can be performed at a temperature of from about 110° C. to 350° C. for a bonding time of less than 3 seconds. A bonding/die attach pressure of 0.2 kg/mm² to 1 kg/mm² can be used for a variety of die sizes (e.g., for die sizes ranging from less than 1×1 mm to 8×8 mm or above). The resulting die/film/substrate assembly can then be processed in at least one thermal operation, such as curing in an oven, wirebonding followed by molding, and the like.

Exemplary sintering films contemplated herein include films produced when said composition is cured, without pressure, at a temperature in the range of about 160-300° C. for a time in the range of from about 10 minutes to 2 hours. The atmosphere for the curing step can be any suitable atmosphere for curing, such as under nitrogen or in an air atmosphere. In some embodiments, the curing step is performed under a nitrogen atmosphere. The duration of the curing step can be modified, as known to those of skill of the art, based on the atmosphere used to conduct the curing step.

Invention methods for forming a sintering paste comprise subjecting the contemplated combination of components for a period of time sufficient to obtain a substantially homogeneous blend. In some embodiments, the components can be mixed for a period of time up to about 3 hours (e.g., from about 1 hour to 3 hours). The combination of components can be mixed at room temperature.

In certain embodiments of the present invention, there are provided sintering pastes comprising the combination of components after mixing for a period of time. The sintering paste is then applied to a substrate (e.g., a lead-frame), followed by a die attach process to the substrate as described herein. The die attach process can be performed using methods as known to those of skill in the art. For example, the die attach can be performed at room temperature using less than 500 mg of pressure. The resulting material can then be cured.

Exemplary sintering pastes contemplated herein include sintering pastes produced when said composition is cured at a temperature in the range of about 160-300° C. for a time in the range of from about 10 minutes to 2 hours. The curing can be performed in an oven, with or without pressure. For example, the curing can be performed in a pressure oven or in a pressureless oven. The atmosphere for the curing step can be any suitable atmosphere for curing, such as under nitrogen or in an air atmosphere. In some embodiments, the curing step is performed under a nitrogen atmosphere. The duration of the curing step can be modified, as known to those of skill of the art, based on the atmosphere used to conduct the curing step.

Various cure schedules can be devised to suit the needs of the practitioner. Lower temperature and longer time period sintering profiles can be used for large size dies, so that the solvent is gradually removed, thereby assuring void-free bond lines. Typical sintering profiles are provided herein, although it should be understood that other similar sintering profiles can be equally effective. Exemplary sintering profiles include a 30 minute ramp from room temperature to 175° C., followed by a 60 minute hold at 175° C.; a 30 minute ramp from room temperature to 200° C., followed by a 60 minute hold at 200° C.; a 30 minute ramp from room temperature to 220° C., followed by a 60 minute hold at 220° C.; a 15 minute ramp from room temperature to 110° C., followed by a 60 minute hold at 110° C., followed by a 60 minute hold at 240° C.; or a 30 minute ramp from room temperature to 250° C., followed by a 60 minute hold at 250° C. Optionally, the sintering profile can include higher temperatures, such as a 60 minute ramp from room temperature to 300° C., followed by a two hour hold at 300° C.

Sintering die attach films and pastes according to the present invention, upon cure, can also be characterized with reference to the hot die shear thereof. As used herein, the "hot die shear" refers to the die shear of the cured film or paste at 260° C. In some embodiments, the hot die shear of said cured film or paste at 260° C. is at least 1.0 kg/mm². In some embodiments, the hot die shear of said film or paste is at least about 1.50 kg/mm². In certain embodiments, the hot die shear of said film or paste is from 1.0 kg/mm² to 4 kg/mm². As described above, the die shear strength is measured on a die shear tester using a die metallized with titanium-nickel-silver and a silver-coated lead-frame substrate.

Sintering die attach films and pastes according to the present invention, upon cure, can also be characterized with reference to the hot, wet die shear thereof at 260° C. after exposure to 85° ° C. at 85% relative humidity for about 3 days; in some embodiments, the hot, wet die shear of said film or paste after exposure to such conditions is at least 1.0 kg/mm²; in some embodiments, the hot, wet die shear of said film or paste after exposure to such conditions is at least 1.0 kg/mm².

In accordance with another embodiment of the present invention, there are provided methods for preparing sintering die attach films and pastes, said method comprising removing substantially all of the non-reactive diluent or solvent from the above-described compositions after application thereof to a suitable substrate.

Suitable substrates contemplated for use herein include lead-frame(s). As used herein, "lead-frame(s)" comprise a base plate consisting of copper or copper alloys, and a protective coating formed on the upper (or both) surface(s) of the base plate. The protective coating is composed of at least one metal selected from the group consisting of gold, gold alloy, silver, silver alloy, palladium or palladium alloy, and has a thickness of about 10-500 angstrom. The protective coating is formed by suitable means, e.g., by vapor deposition. It is possible to form an intermediate coating of nickel or nickel alloys between the surface of the base plate and the protective coating, by means of vapor deposition or wet plating. A suitable thickness for the intermediate coating is within the range of about 50-20,000 angstrom. See, for example, U.S. Pat. No. 5,510,197, the entire contents of which are hereby incorporated by reference herein.

Optionally, the substrates for use in the present invention include laminate substrate(s) designed for semiconductor packages (e.g., BT substrate, FR4 substrate, and the like), polyethylene terephthalate, polymethyl methacrylate, polyethylene, polypropylene, polycarbonate, an epoxy resin, polyimide, polyamide, polyester, glass, and the like.

In accordance with yet another embodiment of the present invention, there are provided methods for preparing sintering die attach films and pastes. For pastes, the methods can comprise curing the above-described compositions after application thereof to a suitable substrate, as described above. During this curing process, the pastes can undergo sintering. For films, the methods can comprise high temperature bonding of the dies and films to a suitable substrate, as described above. During this bonding process, the films can undergo sintering. Optionally, the methods for preparing sintering die attach films can include a curing process to optimize the sintering morphology and for device stress stabilization. The curing process can be performed in an oven.

As described above, the sintering films and pastes according to the present invention can be used for die attach. The die surface can optionally be coated with a metal, such as silver.

In accordance with yet another embodiment of the present invention, there are provided articles comprising sintering die attach films and pastes as described herein adhered to a suitable substrate therefor.

Articles according to the present invention can be characterized in terms of the adhesion of the cured sintering die attach film or paste to the substrate; typically the adhesion is at least about 1.0 kg/mm² at 260° C. (e.g., at least about 1.5 kg/mm² at 260° C.); in some embodiments, the adhesion is at least about 2.5 kg/mm² at 260° C. As described above, the die shear strength is measured on a die shear tester using a die metallized with titanium-nickel-silver and a silver-coated lead-frame substrate.

As readily recognized by those of skill in the art, the dimensions of invention articles can vary over a wide range. Exemplary articles include, for example, dies. Dies for use in the present invention can vary in surface area. In some embodiments, dies for use in the present invention can range from 1×1 mm or less to 8×8 mm or greater.

In accordance with yet another embodiment of the present invention, there are provided methods for laminating a sintering film onto a wafer, comprising:
  applying a composition for a sintering film as described herein to a wafer; and
  laminating the composition onto the wafer at a temperature of 100° C. or lower and a pressure of 40 psi or lower.

In accordance with yet another embodiment of the present invention, there are provided methods for preparing a conductive network, said method comprising:
  applying a composition for a sintering film as described herein to a wafer;
  laminating the composition onto the wafer at a temperature of 100° C. or lower and a pressure of 40 psi or lower to result in a film attached to a wafer;
  dicing the film attached to the wafer to result in a die and film; and
  bonding the die and film to a substrate under a pressure of 0.2 kg/mm² to 1 kg/mm².

In accordance with yet another embodiment of the present invention, there are provided methods for preparing a conductive network, said method comprising:
  applying a composition for a sintering paste as described herein to a substrate (e.g., a lead-frame) in a predefined pattern;
  die attaching the composition to a die and the substrate; and
  curing the composition.

Optionally, the composition can be applied such that the resulting film or paste is present at a thickness of at least about 5 microns. For example, the thickness of the film can be from about 5 microns to about 50 microns (e.g., from about 5 microns to about 30 microns) and the thickness of the paste can be from about 5 microns to about 50 microns.

In accordance with still another embodiment of the present invention, there are provided conductive networks prepared as described herein.

The sintering films and pastes described herein can be used within the electronics industry and other industrial applications. For example, the sintering films and pastes described herein can be used for die attach applications on lead-frames for power discretes, for clip attach applications as wire bond replacements for high performance discretes, for heat slug attach applications for the cooling of power discretes with exposed pads, for single- and multi-die devices, and for other devices requiring high electrical and/or thermal conductivity between a die and a frame.

FIGS. 1A-B and 2A-B depict sintering films (also referred to as "die attach film") prepared from the compositions of the present invention that are manufactured in a flexible roll format (10) or in a pre-cut format (20). In the flexible roll format or the pre-cut format, the film can be sandwiched between suitable substrates for use in those formats, including release liners, dicing tape, and the like. Release liners may be about 50 μm, and films may be about 15 to 30 μm. In FIG. 1A, the flexible roll format (10) includes a sintering film (14) that is sandwiched between two release liners: an easy release liner (16) and a tight release liner (18). A leading release liner (12) is also depicted, which is a portion of a release liner that is not sandwiched to the sintering film. FIG. 1B is a cross sectional view of FIG. 1A along line A-A, showing the sintering film (14) sandwiched between release liners (16) and (18). FIG. 2A depicts a precut format (20), and FIG. 2B represents cross sectional view of FIG. 2A along line B-B showing the sintering film (22) sandwiched between dicing tape (24) and a release liner (26).

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

Example 1

Sintering Films

Formulations according to the invention were prepared by combining the components set forth in Table 1, as follows.

TABLE 1

| Formulation Ingredient | A | B | C |
|---|---|---|---|
| | Amount (wt %) | | |
| Epoxy Resin 1[1] | 2.6 | 3.75 | 6.2 |
| Epoxy Resin 2[2] | 0.55 | 1.05 | 0.8 |
| Acrylic Polymer[3] | 3.1 | 1.86 | — |
| Latent Fluxing Agent[4] | 1.73 | 1.62 | 1.50 |
| Conductivity Promoter | 0.02 | 0.02 | — |
| Silver Filler(s) | 92.0 | 91.7 | 85.6 |
| Low CTE Alloy | — | — | 5.9 |
| Total | 100.00 | 100.00 | 100.00 |

[1]Epoxy Resin 1 is an adduct of an aliphatic epoxy and an aromatic epoxy resin.
[2]Epoxy Resin 2 is an adduct of an epoxy resin with a CTBN rubber.
[3]Acrylic Polymer is an acrylic copolymer having a molecular weight (Mw) of 850,000 and a glass transition temperature of 12° C.
[4]Latent Fluxing Agent is an adduct of a vinyl ether and a carboxylic acid.

Sintering films were prepared for each of formulations A, B, and C shown in Table 1 by mixing the components shown in Table 1 and solvent (approximately 30% by weight of the composition) at a high shear speed to result in a coating slurry. The coating slurry was applied to a release liner and heated for 5 minutes at about 120-150° C. to remove solvent and to stabilize the composition into a sintering film. Then, a cover liner was applied to the sintering film and laminated at 110° C. and 30 psi to allow the B-staged film to stick onto the cover liner, and the resulting material was wound to a sintering film roll. Die attach was achieved by the following steps: peeling off the cover liner; laminating the film onto a wafer at about 90-95° C. and about 30-40 psi; peeling off the release liner; laminating the film to dicing tape; dicing the film and wafer; picking up the diced die and film from the dicing tape; attaching the diced die and film to the lead-frame; bonding the die, film, and lead-frame together under elevated temperature and pressure and under the time conditions as described herein for the die attach bonding conditions; and optionally performing a cure or a sintering process for the die attached device according to the cure conditions as described herein. The resulting material was tested for hot die shear strength, as further described below.

To prepare the test materials for the in-package property and reliability tests, a wire-bonding and molding process was performed after the die attach bonding and curing.

Figure 3A:
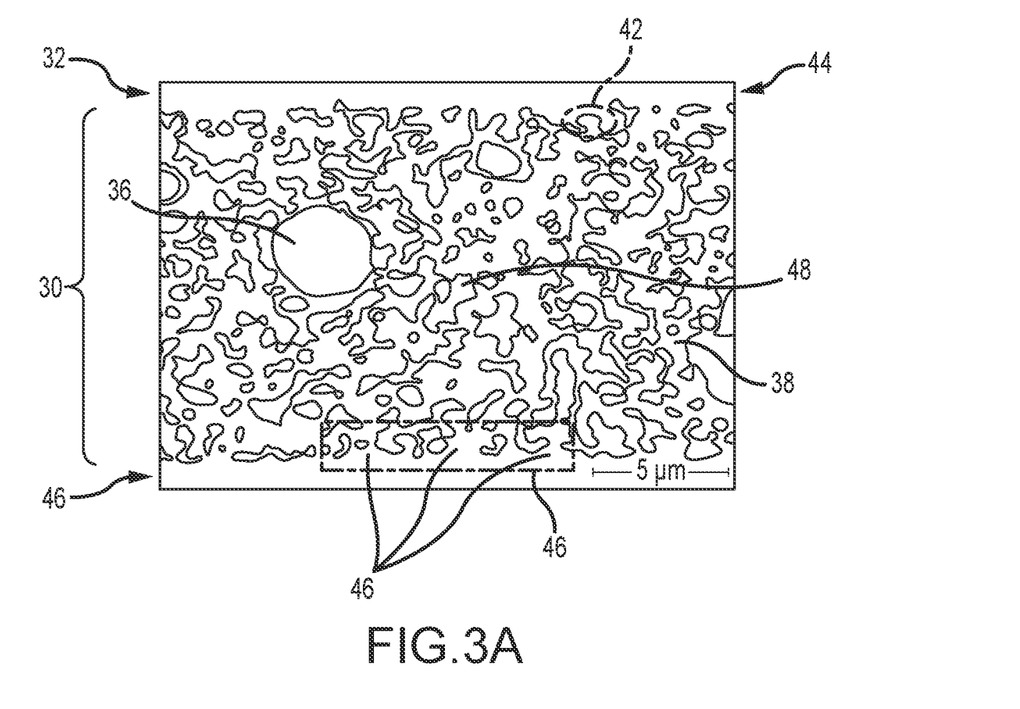
FIG. 3A is a depiction of a cross sectional view of a sinterable film prepared from the compositions described herein.
Figure 3B:
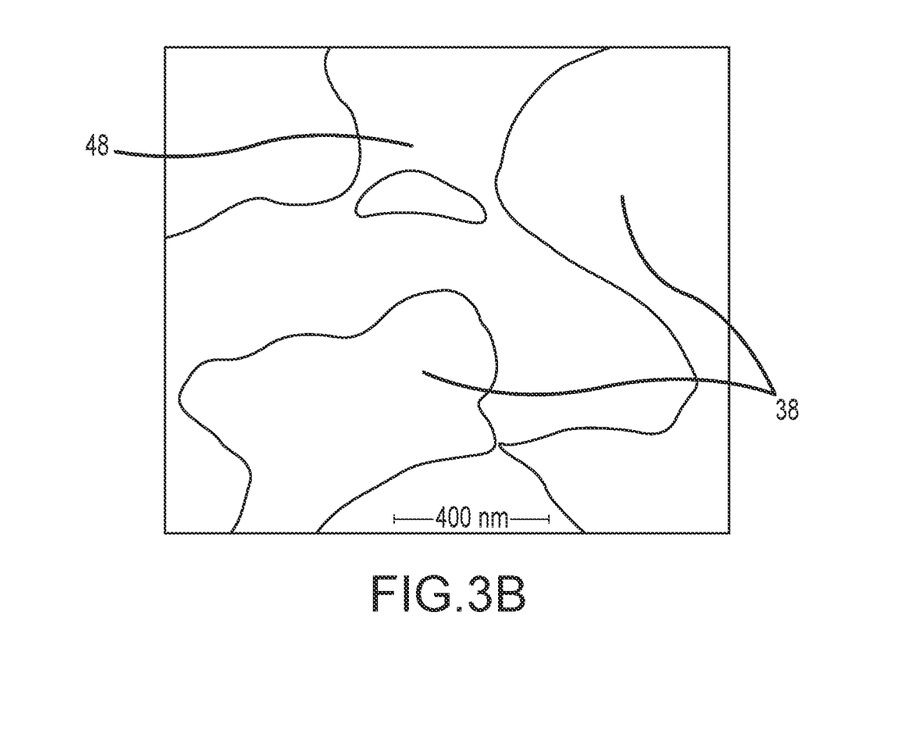
FIG. 3B is a zoomed view of a FIG. 3A.

FIG. 3A is an exemplary Scanning Electron Microscopy (SEM) representation of a cross section of a sintered film (30) between a TiBiAg die surface (32) and a silver coated lead-frame (46) that has been taken after focused ion beam (FIB) milling. FIG. 3B is a zoomed in view of a portion of film (30). The sintered film (30) includes particulate filler (36), sintered silver (38), resin (48), and pores or porous areas (42). In addition, the sinterable film includes intermetallic layers present in the material (e.g., an intermetallic layer formed between the titanium-nickel-silver die surface and the sintered film and an intermetallic layer formed between the sintered film and the silver coated lead-frame). A first intermetallic layer (44) is formed at the interface between the TiNiAg die surface (32) and sintered film (30). A second intermetallic layer (46) is formed at the interface between the silver coated lead-frame (46) and the sintered film (30).

The die shear strength, thermal conductivity and resistivity, and electrical conductivity were measured, as detailed below. The results are shown in Table 2.

The hot die shear strength (HDSS) was measured on a Dage series 4000 die shear tester using a silicon die metallized with titanium-nickel-silver and a silver-coated copper substrate.

The thermal conductivity for the bulk cured material was measured with a thermal conductivity tester (LFA 447 NanoFlash, commercially available from NETZSCH-Geratebau GmbH, Germany) and the thermal resistivity was measured with the T3Ster transient temperature measurement system (Mentor Graphics; Wilsonville, OR).

The electrical conductivity was measured as the volume resistivity, which was tested using a four point probe on a Megohm bridge.

TABLE 2

| Formulation | A | B | C |
|---|---|---|---|
| HDSS (kg/mm$^2$) | >1.5 | >1.5 | >1.5 |
| Thermal Conductivity (bulk) (W/mK) | 49 | 101 | 113 |
| Thermal Resistivity (Rth in package) (K/W) | 0.44 | 0.4 | 0.34 |
| Volume Resistivity (bulk) (Ohm-cm) | 0.000007 | 0.000007 | 0.000008 |

The results shown in Table 2 demonstrate improved hot die shear strength, thermal conductivity and resistivity, and electrical conductivity for the inventive compositions.

Example 2

Sintering Pastes

Formulations according to the invention were prepared by combining the components set forth in Table 3, as follows.

TABLE 3

| Formulation Ingredient | D | E | F |
|---|---|---|---|
| | Amount (wt %) | | |
| Epoxy Resin 1[5] | 4.85 | 2.59 | 2.59 |
| Epoxy Resin 2[6] | — | 1.72 | — |
| Polyvinyl Acetal Resin | — | — | 1.72 |
| Latent Fluxing Agent[7] | 1.34 | 1.72 | 1.72 |
| Conductivity Promoter | 0.02 | 0.02 | 0.02 |

TABLE 3-continued

| Formulation Ingredient | D | E | F |
|---|---|---|---|
| | Amount (wt %) | | |
| Silver Filler | 74.65 | 75.85 | 75.85 |
| Particulate Filler | 5.18 | 4.30 | 4.30 |
| Acetylacetone | 6.98 | 6.90 | 6.90 |
| Propylene Carbonate | 6.98 | 6.90 | 6.90 |
| Total | 100.00 | 100.00 | 100.00 |

[5]Epoxy Resin 1 is an adduct of an aliphatic epoxy and an aromatic epoxy resin.
[6]Epoxy Resin 2 is an adduct of an epoxy resin with a CTBN rubber.
[7]Acrylic Polymer is an acrylic copolymer having a molecular weight (Mw) of 850,000 and a glass transition temperature of 12° C.

Sintering pastes were prepared for each of formulations D, E, and F shown in Table 3 by mixing the components at room temperature. The pastes were dispensed onto a lead-frame substrate and a die attach bonding process was performed under the conditions as described above. The die attached device was cured according to the cure conditions as described herein. The resulting material was tested for hot die shear strength. To prepare the test materials for performance and reliability tests, a wire-bonding and molding process was performed after the die attach bonding and curing.

The die shear strength, thermal conductivity, and electrical conductivity were measured according to the methods described above in Example 1. The results are shown in Table 4.

TABLE 4

| Formulation | D | E | F |
|---|---|---|---|
| HDSS (kg/mm$^2$) | >1 | >1 | >1 |
| Thermal Conductivity (bulk) (W/mK) | 121 | 49 | 52 |
| Volume Resistivity (bulk) (Ohm-cm) | 0.00001 | 0.00002 | 0.00002 |

The results shown in Table 4 demonstrate suitable and/or improved hot die shear strength, thermal conductivity, and electrical conductivity for the inventive compositions.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following That which is claimed is:

1. A composition for a sintering film, comprising:
   a thermosetting resin component, comprising an epoxy comprising an adduct of an aliphatic epoxy and aromatic epoxy, and an epoxy comprising an adduct of an epoxy resin and CTBN rubber, that is present in the composition in and amount of 1-6 wt %, and
   optionally, at least one additional component selected from the group consisting of one or more acrylic monomer, oligomer, or polymer, a polyurethane, a cyanate ester, a polyvinyl alcohol, a polyester, a polyurea, a polyvinyl acetal resin, a phenoxy resin, a maleimide, a bismaleimide, a polyimide, or mixtures thereof;
   one or more conductive fillers;
   a fluxing agent;
   a polyvinyl acetal resin; and
   optionally an organic diluent,
   wherein the composition undergoes lamination onto a wafer at a temperature of 90° C. or lower and a pressure of 40 psi or lower;
   wherein the composition, when cured or sintered, has a die shear strength of at least 1.0 kg/mm2 at 260° C.;
   the composition, when attached to a die, bonds to a substrate at a pressure of 0.2 kg/mm2 to 1 kg/mm2, and
   wherein the one or more conductive fillers are present in the composition in an amount from about 65 percent by weight to about 75 percent by weight.

2. The composition of claim 1, further comprising one or more of a fluxing agent, a flow additive, an adhesion promoter, a rheology modifier, a conductivity promoter, a surfactant, a toughening agent, a film flexibilizer, an epoxy-curing catalyst, a curing agent, a radical polymerization regulator, a radical stabilizer, or mixtures thereof.

3. The composition of claim 1, wherein the thermosetting resin component comprises one or more epoxy monomers, oligomers, or polymers and the one or more epoxy monomers, oligomers, or polymers comprises an epoxy having an aliphatic backbone, an aromatic backbone, or a mixture thereof.

4. The composition of claim 1, wherein the thermosetting resin component comprises one or more epoxy monomers, oligomers, or polymers and the one or more epoxy monomers, oligomers, or polymers comprises a functionalized epoxy monomer, oligomer, or polymer.

5. The composition of claim 1, wherein the thermosetting resin component is present in the composition in an amount of up to 10 percent by weight of the total solids content of the composition.

6. The composition of claim 1, wherein the one or more conductive fillers includes silver.

7. The composition of claim 6, wherein the one or more conductive fillers further comprises one or more of nickel, copper, silver-plated metals, nickel-plated metals, silver-plated graphite, silver-coated polymers, nickel-plated graphite, or nickel-plated polymers.

8. The composition of claim 1, wherein the one or more conductive fillers is present in the composition in an amount of at least 65 percent by weight of the total solids content of the composition.

9. The composition of claim 1, further comprising a particulate filler.

10. The composition of claim 9, wherein the particulate filler includes nickel-based alloys, iron-based alloys, zirconium tungstate, silica, or mixtures thereof.

11. The composition of claim 9, wherein the particulate filler has a coefficient of thermal expansion of 10 ppm/° C. or lower.

12. The composition of claim 9, wherein the particulate filler is present in the composition in an amount of up to 20 percent by weight of the total solids content of the composition.

13. The composition of claim 1, wherein the organic diluent is a reactive organic diluent, a non-reactive organic diluent, or a mixture thereof.

* * * * *